United States Patent [19]
Ina

[11] Patent Number: 6,080,512
[45] Date of Patent: Jun. 27, 2000

[54] SEMICONDUCTOR EXPOSURE METHOD AND APPARATUS, AND A RETICLE THEREFOR

[75] Inventor: Hideki Ina, Utsunomiya, Japan

[73] Assignee: Canon Kabushiki Kaisha, Tokyo, Japan

[21] Appl. No.: 09/066,839

[22] Filed: Apr. 28, 1998

[30] Foreign Application Priority Data

Dec. 22, 1997 [JP] Japan .................................... 9-365714

[51] Int. Cl.[7] ...................................................... G03F 9/00

[52] U.S. Cl. .................................................................. 430/5

[58] Field of Search ................................. 430/5, 322, 323; 378/35, 34; 355/53

[56] References Cited

U.S. PATENT DOCUMENTS 5,284,724   2/1994   Noelscher et al. ........................... 430/5

Primary Examiner—S. Rosasco
Attorney, Agent, or Firm—Fitzpatrick, Cella, Harper & Scinto

[57] ABSTRACT

A pattern exposure and transfer method wherein a reticle has a pattern, including a chromium pattern, to be transferred, the chromium pattern of the reticle having a thickness, with respect to a wavelength $\lambda$, which is approximately $N \cdot \lambda/2$ or $N \cdot \lambda$, where N is a positive integer. The reticle is illuminated with light having a center wavelength $\lambda$, whereby the pattern of the reticle is transferred onto a photosensitive substrate through a projection optical system. The transfer of the reticle pattern is executed in a state of illumination $\sigma$ such that no sub-peak appears in an optical image.

25 Claims, 5 Drawing Sheets

SEMICONDUCTOR EXPOSURE METHOD AND APPARATUS, AND A RETICLE THEREFOR

FIELD OF THE INVENTION AND RELATED ART

This invention relates to a semiconductor exposure method and apparatus which is based on optical lithography wherein a fine electronic circuit pattern for IC, LSI or VLSI formed on a reticle is transferred to a wafer. In another aspect, the invention is concerned with a reticle to be used with such an exposure method and apparatus.

Projection exposure apparatuses for semiconductor device manufacture are required to perform projection exposure of a high resolving power, for printing a circuit pattern on the surface of a reticle onto a wafer, to meet increases in the density of an integrated circuit. Examples of improving projection resolution for a circuit pattern include a method wherein the wavelength of exposure light is held fixed while the numerical aperture of a lens of a projection optical system is enlarged, or a method wherein a shorter wavelength is used, such as the use of i-line rather than g-line or the use of an emission wavelength of an excimer laser rather than i-line.

In conventional semiconductor exposure apparatuses, however, for projection exposure with higher resolution, it is necessary to reduce the amount of aberration of a projection optical system when a pattern of a reticle is projected onto a wafer. If comma aberration which is asymmetric aberration, is large, the asymmetry of coma aberration and asymmetry of a projection optical system act together so that the image performance is deteriorated considerably. For this reason, a projection optical system should have high uniformness. Additionally, for an enlarged numerical aperture of a lens of a projection optical system, also from the standpoint of design value or production error, remaining aberrations have to be reduced.

As a result, a projection optical system has to include many lenses and it leads to complicatedness and bulkiness of the projection optical system. Further, it takes a long time to produce a projection optical system to reduce manufacturing errors, and this causes an increase of cost.

SUMMARY OF THE INVENTION

It is an object of the present invention to provide a semiconductor exposure method by which a sufficiently high resolving power is accomplished even when a projection optical system having coma aberration is used.

It is another object of the present invention to provide a semiconductor exposure apparatus by which a sufficiently high resolving power is accomplished even when a projection optical system having coma aberration is used.

It is a further object of the present invention to provide a reticle for semiconductor exposure, which can be suitably used in a semiconductor exposure method or apparatus such as described above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
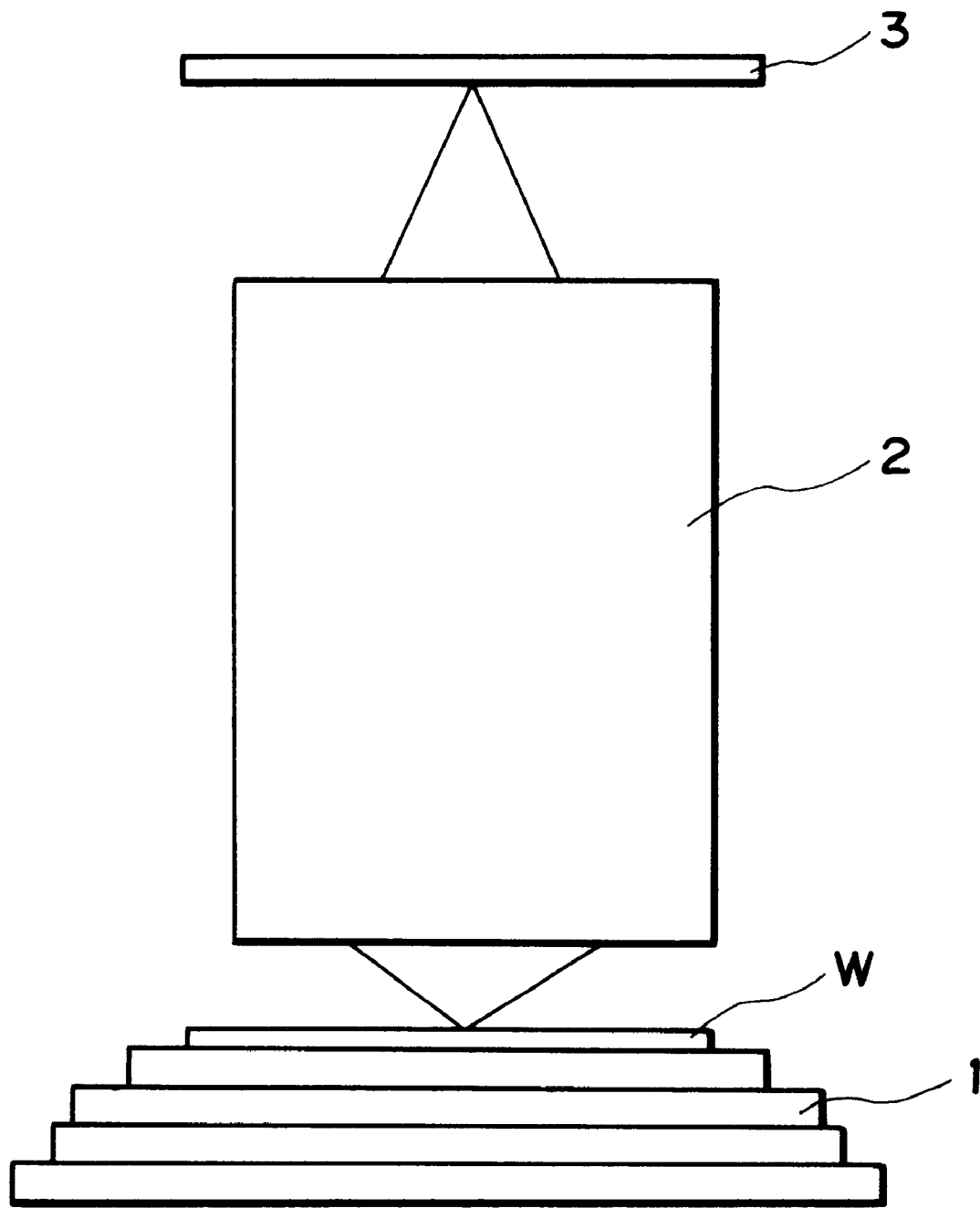
FIG. 1 is a schematic and side view of a semiconductor exposure apparatus.

The invention will be described with reference to preferred embodiments shown in the drawings.

Figure 2:
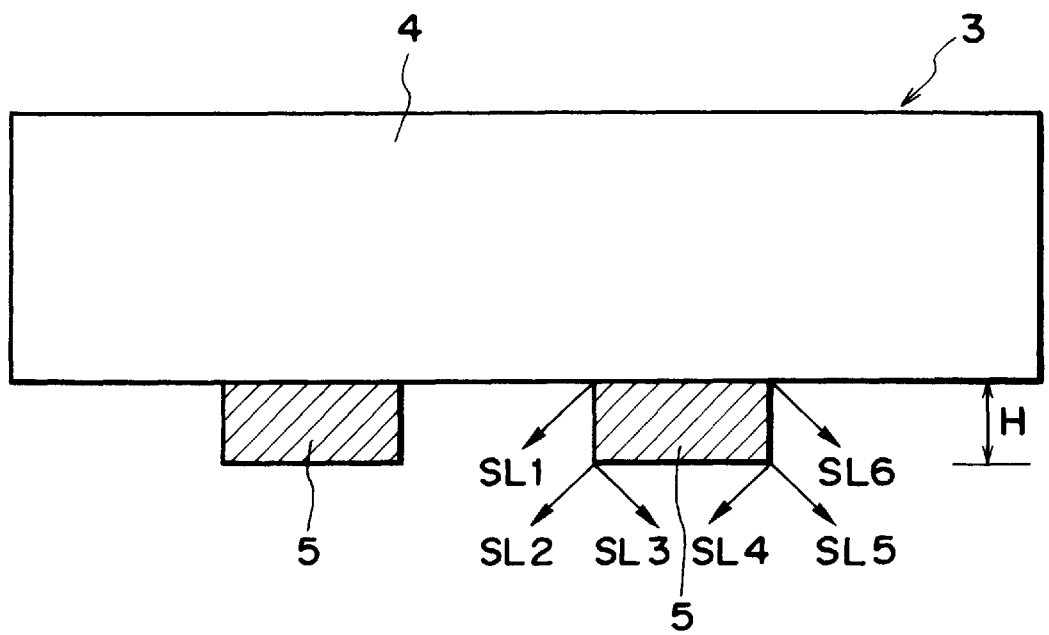
FIG. 2 is an enlarged and schematic view of a reticle according to a first embodiment of the present invention.

FIG. 1 is a side view of an exposure apparatus, wherein a wafer is placed on a stage base 1. Disposed above the wafer is a projection optical system 2, and there is a reticle 3 above the projection optical system 2. FIG. 2 is a side view of a reticle according to a first embodiment of the present invention. Reticle 3 comprises a quartz glass substrate 4 on which a chromium layer 5 of a predetermined height H is formed at a predetermined position thereon.

Here, the predetermined height H is a value with respect to a center wavelength $\lambda$ to be used for exposure, which value is close to one that satisfies a relation $H=N\cdot\lambda/2$ (N is a positive integer). Particularly, in this embodiment, it is a value close to one that satisfies the following relation:

$$H=N\cdot\lambda \text{ (N is a positive integer).}$$

The height H of chromium layer 5 differs with the center exposure wavelength used. Heights H of chromium layer 5 for cases where the center exposure wavelength is that of an i-line stepper (365 nm), a KrF stepper (248 nm) and an ArF stepper (193 nm) with N being equal to 1 or 2, are such as shown in Table 1 below:

TABLE 1

|  | $\lambda$ | $2\lambda$ |
| --- | --- | --- |
| i-line | 365 nm | 730 nm |
| KrF | 248 nm | 496 nm |
| ArF | 193 nm | 386 nm |

In FIG. 2, denoted at SL1 is scattered light at a lower left portion of the chromium layer 5, and denoted at SL2 is scattered light at an upper left portion of the chromium layer 5, advancing leftwardly. Denoted at SL3 is scattered light at the upper left portion of the chromium layer 5, advancing rightwardly. Denoted at SL4 is scattered light at an upper right portion of the chromium layer 5, advancing rightwardly. Denoted at SL6 is scattered light at a lower right portion of the chromium layer 5.

A pattern formed on the reticle 3 is transferred by exposure onto the surface of a wafer W, through the projection optical system 2. By means of the projection optical system 2, scattered lights SL1, SL2, SL3, SL4, SL5 and SL6 being scattered at edges of chromium layer 5 are imaged on the wafer W. Light intensities of them are now considered. Here, it is assumed that: while using scattered light SL1 as a reference, scattered lights SL2, SL3, SL4 and SL5 at the upper portion of chromium layer 5 have a delay of phase corresponding to the height H of the chromium layer; while taking into account coma aberration remaining in the projection optical system 2, rightward scattered lights SL3, SL5 and SL6 have a delay of phase corresponding to coma C. Then, the phases of scattered lights SL1, SL2, SL3, SL4, SL5 and SL6 can be expressed as follows:

Phase P1 of Light SL1:EXP(jωt)

Phase P2 of Light SL2:EXP{j(ωt+H)}

Phase P3 of Light SL3:EXP{(j(ωt+H+C)}

Phase P4 of Light SL4:EXP{(j(ωt+H)}

Phase P5 of Light SL5:EXP{j(ωt+H+C)}

Phase P6 of Light SL6:EXP{J(ωt+C)}

Next, the imaging performance of the projection optical system 2, as influenced by coma, may be expressed by use of the phases P1–P6. First, when the influence of coma is to be considered, a particular note may be paid to the difference ($I_{def}$) between the intensity $I_L$, upon the wafer W, of scattered lights SL1, SL2 and SL3 being scattered at the left side of the chromium layer 5 and the intensity $I_R$ of scattered lights SL4, SL5 and SL6 being scattered at the right side of the chromium layer.

Intensities $I_L$ and $I_R$ can be expressed by the following equations where a square of phase $P_L$ or $P_R$ is integrated with respect to time, that is:

$$I_L = \int_0^{2\pi/\omega} P_L^2 \, dt$$

$$I_R = \int_0^{2\pi/\omega} P_R^2 \, dt$$

where $P_L$=P1+P2+P3  $P_R$=P4+P4+P6

Since the intensity difference $I_{def}$ corresponds to the difference between intensities $I_L$ and $I_R$, $I_{def}=I_L-I_R$. Also, real parts of phases $P_L$ and $P_R$ are as follows:

Re($P_L$)=cos(ωt)+cos(ωt+H)+cos(ωt+H+C)

Re($P_R$)=cos(ωt+H)+cos(ωt+H+C)+cos(ωt+C).

Figure 3:
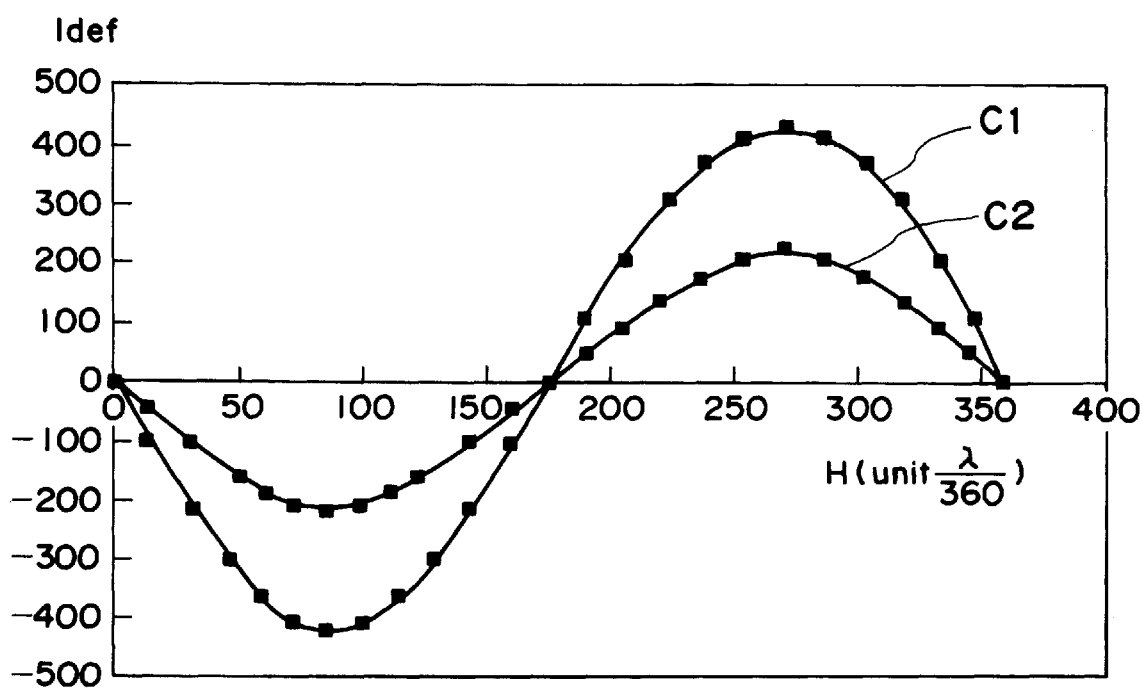
FIG. 3 is a graph for explaining the relation between intensity difference and chromium layer height.

Numerical integration may be done only to the real part of the intensity difference $I_{def}$ on the basis of the above equations, and the relation between the intensity difference $I_{def}$ and the height H of chromium layer 5 may be determined. The result may be such as shown in the graph of FIG. 3. This graph is plotted wherein the intensity difference $I_{def}$ is taken on the axis of ordinate and the height H of the chromium layer 5 is taken on the axis of the abscissa. The graph shows a curve C1 calculated while taking the amount of coma of projection optical system 2 as λ/10, and a curve C2 calculated while taking the amount of coma as λ/20. Since, in these curves C1 and C2, the height H of the chromium layer 5 on the axis of abscissa is standardized with respect to the center exposure wavelength λ, there is no necessity of limiting the center exposure wavelength λ.

Thus, from these two curves, it is seen that the intensity difference $I_{def}$ is proportional to the coma aberration and the period changes like a sine function of λ. Also, the height H of a chromium layer with which the intensity difference $I_{def}$ becomes equal to zero is not dependent on the coma but on those λ/2, λ, 3λ/2, . . . , which satisfy the following relation:

H=m·λ/2 (m is a positive integer)

The condition having been described in the foregoing, that is, a multiple of a half of the wavelength by an integral number, concerns occasions where illumination σ (partially coherent factor) is large. When the illumination σ decreases, a further limitation may be necessary.

Figure 4:
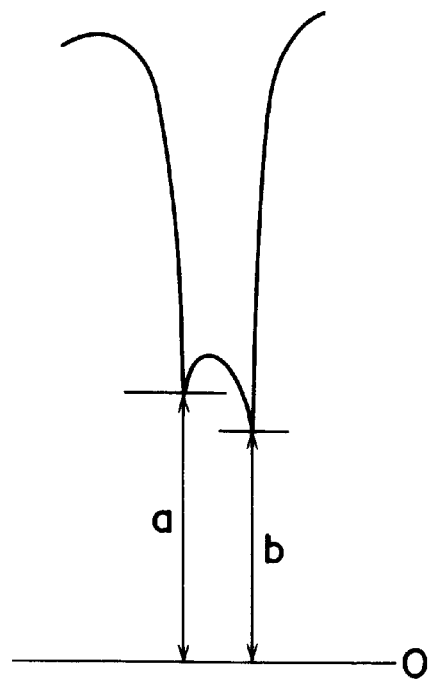
FIG. 4 is a graph for explaining an image in a case where illumination σ is large.
Figure 5:
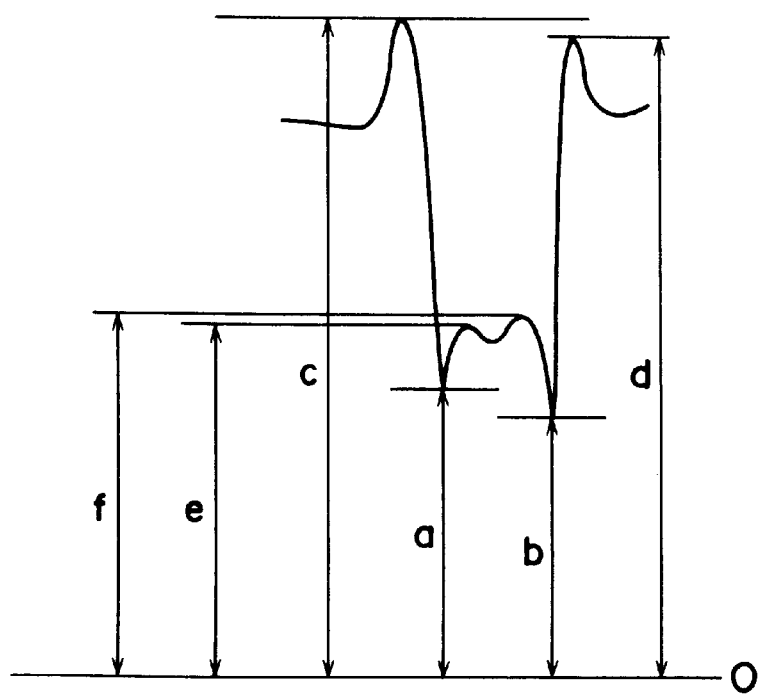
FIG. 5 is a graph for explaining an image in a case where illumination σ is small.

FIG. 4 is a graph showing an optical image being photoelectrically converted, in a case where illumination σ is large. FIG. 5 is a graph showing an optical image being photoelectrically converted, in a case where illumination σ is small. As regards an output difference between left-hand and right-hand portions of FIG. 4, a symmetry is provided when the substantial height H of chromium layer 5 as described is equal to a multiple of a half of the wavelength by an integral number, as has been explained above. Also, this similarly applies to portions "a" and "b" in the case of FIG. 5.

Figure 6:
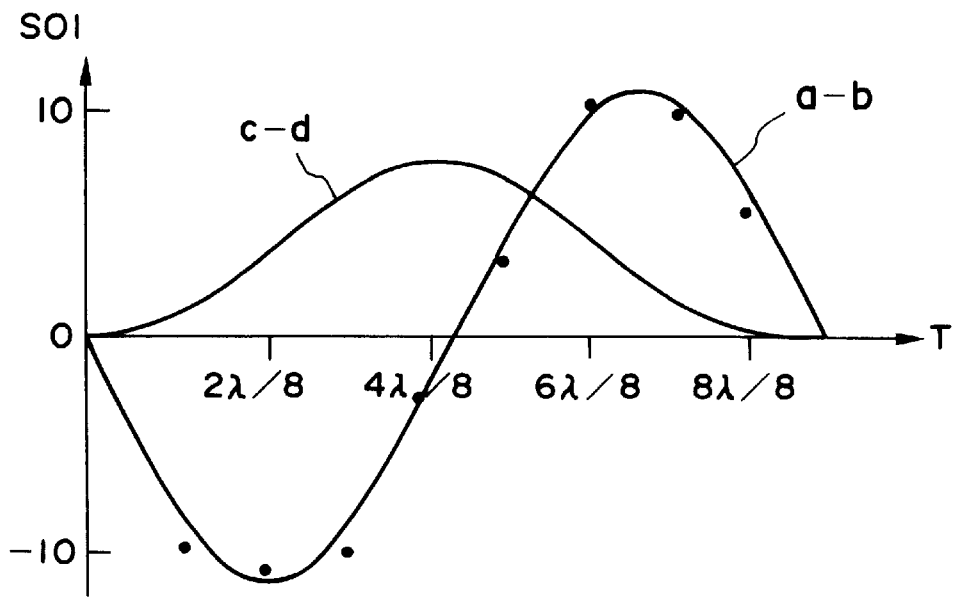
FIG. 6 is a graph for explaining the relation between symmetry of the image of FIG. 5 and height T of a chromium layer.

On the other hand, if illumination σ becomes small, sub-peaks such as at c and d in FIG. 5 are produced. According to experiments and simulations, it has been confirmed that the difference between these sub-peaks (i.e., "c–d") acts in a way different from that of the above-described "a–b". FIG. 6 illustrates the relation of asymmetry "a–b" and "c–d" of image with respect to the substantial chromium layer. In FIG. 6, it is seen that "a–b" is a sine wave of a period λ while "c–d", although it has a period λ, is a function of a square of sin(λ/2). For reference, the asymmetry "e–f" of an inside sub-peak is opposite in sign (positive/negative) to "c–d" and, while it has a period λ, it is a function of a square of sin(λ/2).

As described, the asymmetry of image of the "a–b" becomes good with a multiple of a half of the wavelength by an integer while, on the other hand, the symmetry of the image of "c–d" becomes good only with a multiple of wavelength by an integer. Thus, it is seen that, for best symmetry for both of "a–b" and "c–d", a multiple of the wavelength by an integer should be administered.

Significant advantages of the present invention will be described with reference to specific examples. There are cases where use of illumination σ made smaller is a requisition. An example is a case wherein a half tone reticle is used to perform exposure to form a contact hole. On that occasion, if the refractive index of the half tone material is N and the thickness thereof is T, the condition for shifting the phase, that functions as a half tone reticle, by 180 deg. is:

(N-1)T=nλ/2 (n is an odd integer).

The refractive index of a material to be used for the half tone reticle may be approximately equal to two. In the equation above, the integer n may be 1. When these conditions are incorporated, from the above equation, it follows that:

(2-1)T=1·λ/2.

thus,

T=λ/2.

This is a multiple of a half of the wavelength and, therefore, the symmetry of the image of "a–b" is in good condition. On the other hand, it is a worst condition for the symmetry of image of "c–d".

When the present invention is applied, from the following condition for a half tone reticle:

$(N-1)T=n\lambda/2$ ($n$ is an odd integer)

$T=m\lambda$ ($m$ is an integer)

a good condition may be defined both for the symmetries of the images of "a–b" and "c–d".

An example of such a condition satisfying the above may be:

From $n=5$ and $m=2$, $N=2.25$.

This may be defined in accordance with the two equations described above.

In practical optical lithography, the tolerance for an intensity difference $I_{def}$ does not become equal to zero but it has a finite value. Therefore, the height H of chromium layer 5 may have a value close to one that satisfies the above-described equation. Here, while calculations have been made with respect to the real parts of $I_L$ and $I_R$ for imaginary parts, the cosine may be changed to sine, and exactly the same results are attainable with numerical integration.

Further, although calculations have been made with an assumption that the scattered lights at the upper and lower portions of the chromium layer 5 have the same intensity, if they have different intensities and calculations are made with an assumption that the intensity of scattered light at the upper portion is a half of that of scattered light at the lower portion, then the phases PL2 and PR2 at the left-hand and right-hand portions can be expressed by the following equation, using P1–P6:

$PL2=P1+P2/2+P3/2$ $PR2=P4/2+P5/2+P6.$

Figure 7:
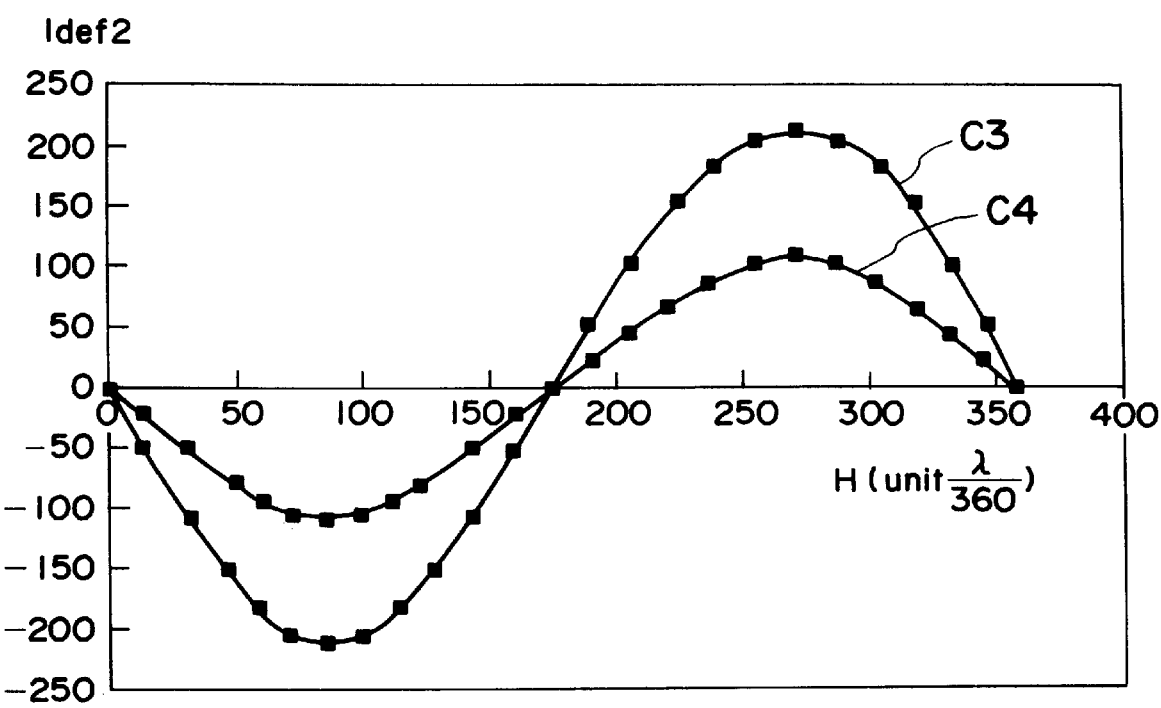
FIG. 7 is a graph for explaining the relation between intensity difference and chromium layer height.

The results of numerical integration of intensity difference $I_{def}$ in this case are such as at curves C3 and C4 in FIG. 7, having the same characteristic but having a half amplitude as those of FIG. 3.

In a case where different exposure wavelengths $\lambda_1$, $\lambda_2$, . . . , are to be used in one and the same exposure apparatus or in different exposure apparatuses and a pattern of a reticle is to be transferred to a wafer W through a projection optical system 2 and by use of such different wavelengths $\lambda_1, \lambda_2, \ldots$, the height H of chromium layer 5 of a reticle to be used may be determined to be a value close to a multiple of a half of each of these different wavelengths by an integral number, preferably a multiple of each of the wavelengths by an integer ($N_1 \cdot \lambda_1$, $N_2 \cdot \lambda_2$, . . . , where $N_1 \cdot \lambda_1 = N_2 \cdot \lambda_2 = $ . . . ). This enables an exposure process of higher resolution.

Figure 8:
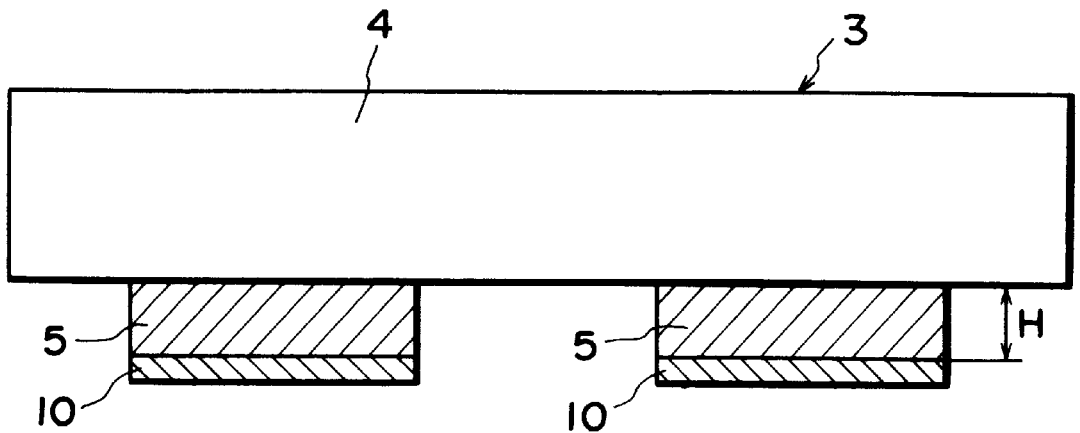
FIG. 8 is an enlarged and schematic view of a dual-layer chromium reticle according to a second embodiment of the present invention.

FIG. 8 is a side view of a dual-layer chromium reticle according to a second embodiment of the present invention. It comprises an accumulation of chromium layer 5 and chromium oxide layer 10 provided on a quartz glass substrate 4. The chromium layer 5 has a height which corresponds to the height H of chromium layer 5 of this embodiment. The amount of height H with respect to the center exposure wavelength is the same as shown in Table 1.

Figure 9:
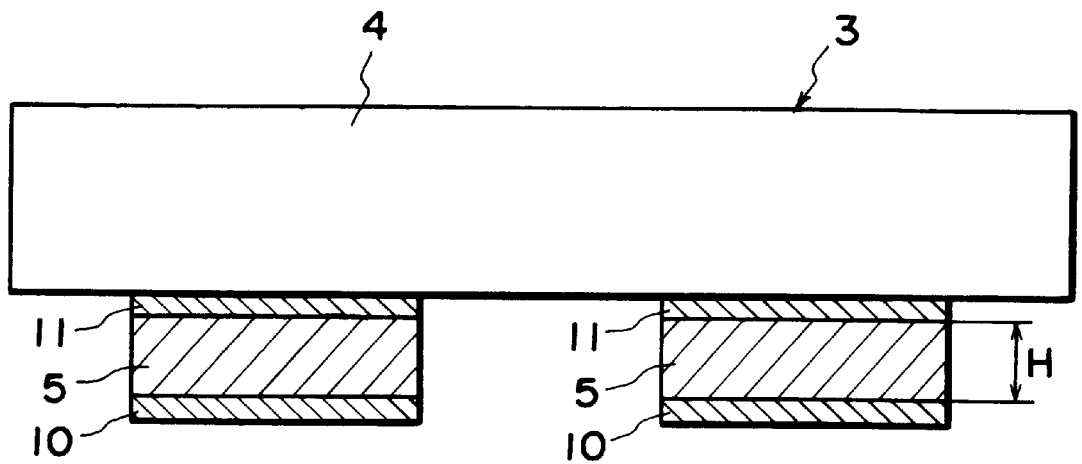
FIG. 9 is an enlarged and schematic view of a triple-layer chromium reticle according to a third embodiment of the present invention.

FIG. 9 is a side view of a triple-layer chromium reticle according to a third embodiment of the present invention. It comprises an accumulation of chromium oxide layer 11, chromium layer 5 and chromium oxide layer 10 provided on a quartz glass substrate 4. Since reflection of light and scattering of light are produced at two boundary surfaces having a large refractive index difference, the thickness of the chromium layer 5 is set to satisfy the height H of chromium layer 5 of this embodiment. The amount of height H with respect to the center exposure wavelength is the same as shown in Table 1.

Figure 10:
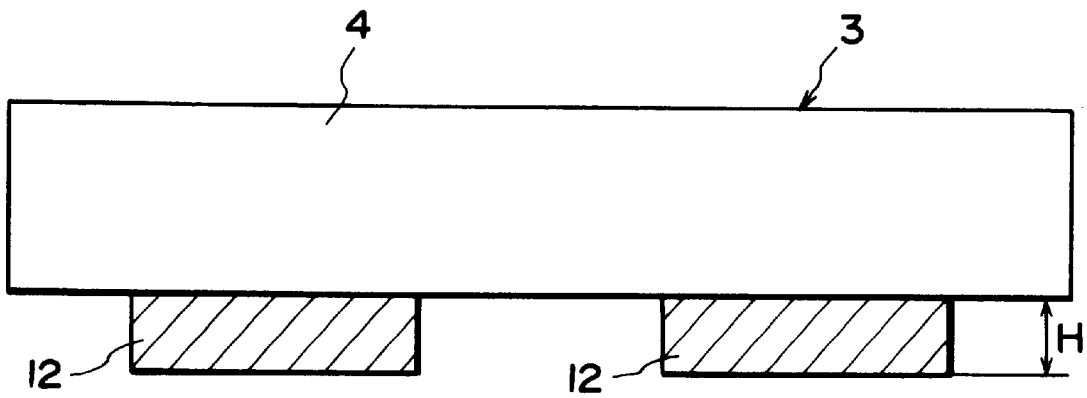
FIG. 10 is an enlarged and schematic view of a half-tone reticle according to a fourth embodiment of the present invention.

FIG. 10 is a side view of a half tone reticle according to a fourth embodiment of the present invention. There are light blocking zone materials 12 which are made of a material effective to transmit 8% of the light quantity, for example, and to shift the phase by 180 deg., for example. The height of these materials corresponds to height H. The amount of height H with respect to the center exposure wavelength is the same as shown in Table 1.

In accordance with a semiconductor exposure method and apparatus according to the embodiments of the present invention as described above, a reticle pattern is used with a center wavelength $\lambda$ and the height of a chromium pattern is set to a value close to $N \cdot \lambda/2$, more particularly, $N \cdot \lambda$. This effectively avoids the influence of a remainder of coma aberration, remaining in a projection optical system. Thus, it enables good resolution performance like that in a case where there is no coma aberration of the projection optical system. This reduces or loosens the required performance of the projection optical system with respect to coma, and it enables reduction in weight, reduction in size and simplification in structure of the projection optical system.

Further, reticle patterns corresponding to different exposure wavelengths $\lambda_1, \lambda_2, \ldots$, may be used and the height of a chromium pattern of each reticle pattern may be set to a value close to a multiple of a half of a corresponding exposure wavelength $80_1, \lambda_2, \ldots$, by an integer, more particularly, to a multiple of the exposure wavelength by an integral number ($N_1 \cdot \lambda_1, N_2 \cdot \lambda_2, \ldots$ ). This effectively avoids the influence of a remainder of coma aberration, remaining in a projection optical system. Thus, it enables good resolution performance like that in a case where there is no coma aberration of the projection optical system. This reduces or loosens the required performance of the projection optical system with respect to coma, and it enables reduction in weight, reduction in size and simplification in structure of the projection optical system.

While the invention has been described with reference to the structures disclosed herein, it is not confined to the details set forth and this application is intended to cover such modifications or changes as may come within the purposes of the improvements or the scope of the following claims.

What is claimed is:

1. A pattern exposure and transfer method, comprising:
   preparing a reticle having a pattern, including a chromium pattern, to be transferred, the chromium pattern of the reticle having a thickness, with respect to a wavelength $\lambda$, which is approximately $N \cdot \lambda/2$, where N is a positive integer; and
   illuminating the reticle with light having a center wavelength 80 , whereby the pattern of the reticle is transferred onto a photosensitive substrate through a projection optical system, the transfer of the reticle pattern being executed in a state of illumination σ such that no sub-Peak appears in an optical image.

2. A pattern exposure and transfer method comprising:
   preparing a reticle having a pattern, including a chromium pattern, to be transferred, the chromium pattern of the reticle having a thickness, with respect to a wavelength $\lambda$, which is approximately $N \cdot \lambda$, where N is a positive integer; and
   illuminating the reticle with light having a center wavelength $\lambda$, whereby the pattern of the reticle is transferred onto a photosensitive substrate through a projection optical system.

3. A method according to claim 2, wherein the chromium pattern has a light transmissivity.

4. A method according to claim 2, wherein the chromium pattern is provided together with a chromium oxide layer, in accumulation.

5. A pattern exposure and transfer method, comprising:
preparing a reticle having a pattern, including a chromium pattern, to be transferred, the chromium pattern of the reticle having a thickness, with respect to wavelengths $\lambda_1, \lambda_2, \ldots$, which is approximately $N_1 \cdot \lambda_2, N_2 \cdot \lambda_2/2, \ldots$ where $N_1, N_2, \ldots$, are positive integers; and
illuminating the reticle with light having wavelengths $\lambda_1, \lambda_2, \ldots$, whereby the pattern of the reticle is transferred onto a photosensitive substrate through a projection optical system.

6. A method according to claim 5, wherein the chromium pattern has a thickness with respect to the wavelengths $\lambda_1, \lambda_2, \ldots$, which is appoximately $N_1 \cdot \lambda_1, N_2 \cdot \lambda_2, \ldots$.

7. A method according to claim 6, wherein illumination with the different wavelengths $\lambda_1, \lambda_2, \ldots$, is performed by use of one and the same exposure apparatus.

8. A method according to claim 6, wherein illumination with the different wavelengths $\lambda_1, \lambda_2, \ldots$, is performed by use of different exposure apparatuses.

9. A method according to claim 6, wherein the chromium pattern has a light transmissivity.

10. A method according to claim 6, wherein the chromium pattern is provided together with a chromium oxide layer, in accumulation.

11. An apparatus for pattern exposure and transfer, comprising:
an illumination system for performing illumination with exposure light having a center wavelength $\lambda$; and
a projection optical system for projecting a pattern of a reticle, illuminated with said illumination system, onto a photosensitive substrate so that, with the projection, the pattern of the reticle is transferred onto the photosensitive substrate, the transfer of the reticle pattern being executed in a state of illumination σ such that no sub-peak appears in an optical image,
wherein the pattern of the reticle includes a chromium pattern having a thickness approximately $N \cdot \lambda/2$, where N is a positive integer.

12. An apparatus for pattern exposure and transfer comprising:
an illumination system for performing illumination with exposure light having a center wavelength $\lambda$; and
a projection optical system for protecting a pattern of a reticle, illuminated with said illumination system, onto a photosensitive substrate so that, with the projection, the pattern of the reticle is transferred onto the photosensitive substrate,
wherein the pattern of the reticle includes a chromium pattern having a thickness approximately $N \cdot \lambda$, where N is a positive integer.

13. An apparatus for pattern exposure and transfer, comprising:
an illumination system for performing illumination with exposure light having wavelengths $\lambda_1, \lambda_2, \ldots$; and
a projection optical system for projecting a pattern of a reticle, illuminated with said illumination system, onto a photosensitive substrate so that, with the projection, the pattern of the reticle is transferred onto the photosensitive substrate,
wherein the pattern of the reticle includes a chromium pattern having a thickness, with respect to the exposure wavelengths $\lambda_1, \lambda_2, \ldots$, which is approximately $N_1 \cdot \lambda_1/2, N_2 \cdot \lambda_2, \ldots$, where $N_1, N_2, \ldots$, are positive integers.

14. An apparatus according to claim 13, wherein the chromium pattern has a thickness approximately $N_1 \cdot \lambda_1, N_2, \cdot \lambda_2, \ldots$.

15. A reticle for pattern exposure and transfer, comprising:
a substrate; and
a chromium pattern formed on the substrate and having a thickness, with respect to an exposure wavelength $\lambda$ to be used therewith, which is approximately $N \cdot \lambda/2$, where N is a positive integer, the transfer of the reticle pattern being executed in a state of illumination σ such that no sub-peak appears in an optical image.

16. A reticle for pattern exposure and transfer, comprising:
a chromium pattern formed on the substrate and having a thickness, with respect to an exposure wavelength $\lambda$ to be used therewith, which is approximately $N \cdot \lambda$, where N is a positive integer.

17. A reticle according to claim 16, wherein the chromium pattern has a light transmissivity.

18. A reticle according to claim 16, wherein the chromium pattern is provided together with a chromium oxide layer, in accumulation.

19. A reticle for pattern exposure and transfer, comprising:
a substrate; and
a chromium pattern formed on the substrate and having a thickness, with respect to exposure wavelengths $\lambda_1, \lambda_2, \ldots$, to be used therewith, which is approximately $N_1 \cdot \lambda_1/2, N_2 \cdot \lambda_2/2, \ldots$.

20. A reticle according to claim 19, wherein the chromium pattern has a thickness close to $N_1 \cdot \lambda_1, N_2 \cdot \lambda_2, \ldots$.

21. A reticle according to claim 20, wherein the chromium pattern has a light transmissivity.

22. A reticle according to claim 20, wherein the chromium pattern is provided together with a chromium oxide layer, in accumulation.

23. A method of forming a pattern on a sensitive material, comprising the steps of:
preparing a half tone reticle having a half tone material, the half tone material of the half tone reticle having a thickness T with respect to a wavelength $\lambda$ and a refractive index R which substantially satisfies a relation:

$$(R-1)T=n\lambda/2$$

$$T=m\lambda,$$

where n is an odd integer and m is an integer; and
illuminating the half tone reticle with light having a center wavelength $\lambda$, whereby a pattern is formed on a photosensitive substrate by projecting light from the half tone reticle through a projection optical system.

24. An apparatus for forming a pattern on a sensitive material, comprising:
an illumination system for illuminating a reticle with exposure light having a center wavelength $\lambda$; and
a projection optical system for projecting light from the reticle, illuminated with said illumination system, onto a photosensitive substrate so that, with the projection, a pattern is formed on the photosensitive substrate,
wherein the reticle comprises a half tone reticle having a half tone material with a thickness T with respect to a wavelength $\lambda$ and a refractive index R which substantially satisfies a relation:

$(R-1)T=n\lambda/2$ $T=m\lambda,$ where n is an odd integer and m is an integer.

25. A reticle for use in forming a pattern on a photosensitive material, comprising:

a substrate; and a half tone material having a thickness T with respect to a wavelength $\lambda$ and a refractive index R which substantially satisfies a relation:

$(R-1)T=n\lambda/2$ $T=m\lambda,$ where n is an odd integer and m is an integer.

* * * * *

UNITED STATES PATENT AND TRADEMARK OFFICE
CERTIFICATE OF CORRECTION

PATENT NO. : 6,080,512

DATED : June 27, 2000

INVENTOR : HIDEKI INA

Page 1 of 2

It is certified that error appears in the above-identified patent and that said Letters Patent is hereby corrected as shown below:

COLUMN 1:
Line 30, "comma" should read --coma--.

COLUMN 4:
Line 8, "integer)" should read --integer).--.

COLUMN 5:
Line 6, "integer)" should read --integer),--.

COLUMN 6:
Line 30, "80 $_1$," should read --$\lambda_1$,--;
Line 32, "($N_1\lambda_1$," should read --$N_1 \cdot \lambda_1$,--;
Line 55, "80 ," should read --$\lambda$,--; and
Line 59, "sub-Peak" should read --sub-peak--.

UNITED STATES PATENT AND TRADEMARK OFFICE
CERTIFICATE OF CORRECTION

PATENT NO. : 6,080,512

DATED : June 27, 2000

INVENTOR : HIDEKI INA

It is certified that error appears in the above-identified patent and that said Letters Patent is hereby corrected as shown below:

COLUMN 8:
Line 7, "$N_2$," should read --$N_2$- --.

Signed and Sealed this

Seventeenth Day of April, 2001

*Attest:*

NICHOLAS P. GODICI

*Attesting Officer*  *Acting Director of the United States Patent and Trademark Office*